(12) United States Patent
Takata

(10) Patent No.: US 10,312,308 B2
(45) Date of Patent: *Jun. 4, 2019

(54) ORGANIC LIGHT EMITTING DEVICE AND METHOD FOR MANUFACTURING SAME

(71) Applicant: JOLED INC., Tokyo (JP)

(72) Inventor: Masakazu Takata, Tokyo (JP)

(73) Assignee: JOLED, INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/974,103

(22) Filed: May 8, 2018

(65) Prior Publication Data

US 2018/0254309 A1 Sep. 6, 2018

Related U.S. Application Data

(63) Continuation of application No. 15/301,797, filed as application No. PCT/JP2015/001910 on Apr. 3, 2015, now Pat. No. 9,997,575.

(30) Foreign Application Priority Data

Apr. 8, 2014 (JP) .................................. 2014-079330

(51) Int. Cl.
*H01L 51/00* (2006.01)
*H01L 27/32* (2006.01)
(Continued)

(52) U.S. Cl.
CPC ...... *H01L 27/3246* (2013.01); *H01L 27/3211* (2013.01); *H01L 27/3276* (2013.01);
(Continued)

(58) Field of Classification Search
CPC .................... H01L 27/3246; H01L 51/0005
See application file for complete search history.

(56) References Cited

U.S. PATENT DOCUMENTS 7,842,947 B2 11/2010 Yoshida et al.
7,888,867 B2 2/2011 Yoshida et al.
(Continued)

FOREIGN PATENT DOCUMENTS

JP 2004-335180 11/2004
JP 2005-276803 10/2005
(Continued)

OTHER PUBLICATIONS

U.S. Appl. No. 15/123,463 to Hiroyuki Ajiki et al., which was filed Sep. 2, 2016.
(Continued)

*Primary Examiner* — Thomas L Dickey
(74) *Attorney, Agent, or Firm* — Greenblum & Bernstein, P.L.C.

(57) ABSTRACT

A light emitting device includes: a base substrate; banks extending in a direction along a surface of the base substrate; and light emitting elements extending along the direction in groove regions defined by the banks. Each light emitting element includes one or more functional layers between a pair of electrodes. Within at least one of the groove regions: a sub-bank extends along the one direction and has a height equal to or smaller than a height of the banks; for each of the one or more functional layers in the groove regions, portions of each of the one or more functional layers on each side of the sub-bank are made of a same material; and a thickness of the one or more functional layers is smaller than a height of the sub-bank.

15 Claims, 10 Drawing Sheets

(51) Int. Cl.
*H01L 51/50* (2006.01)
*H05B 33/14* (2006.01)

(52) U.S. Cl.
CPC .......... *H01L 51/0003* (2013.01); *H01L 51/50* (2013.01); *H05B 33/145* (2013.01)

(56) References Cited

U.S. PATENT DOCUMENTS

| | | | |
|---|---|---|---|
| 9,997,575 B2 * | 6/2018 | Takata | .................... H01L 51/50 |
| 2005/0285509 A1 | 12/2005 | Funamoto et al. | |
| 2006/0017375 A1 | 1/2006 | Noguchi et al. | |
| 2007/0200488 A1 | 8/2007 | Ito | |
| 2009/0160322 A1 | 6/2009 | Yoshida et al. | |
| 2016/0293681 A1 | 10/2016 | Shinokawa et al. | |

FOREIGN PATENT DOCUMENTS

| | | |
|---|---|---|
| JP | 2006-059796 | 3/2006 |
| JP | 2007-234232 | 9/2007 |
| JP | 2007-311236 | 11/2007 |
| JP | 2009-200049 | 9/2009 |

OTHER PUBLICATIONS

International Search Report (ISR) from International Searching Authority (Japan Patent Office) in International Pat. Appl. No. PCT/JP2015/001910, dated Jun. 30, 2015.

\* cited by examiner

Apply bank material

Expose

Develop

Apply bank material

Expose

Develop

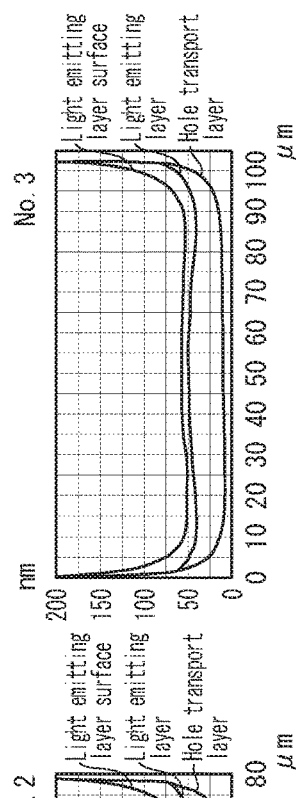
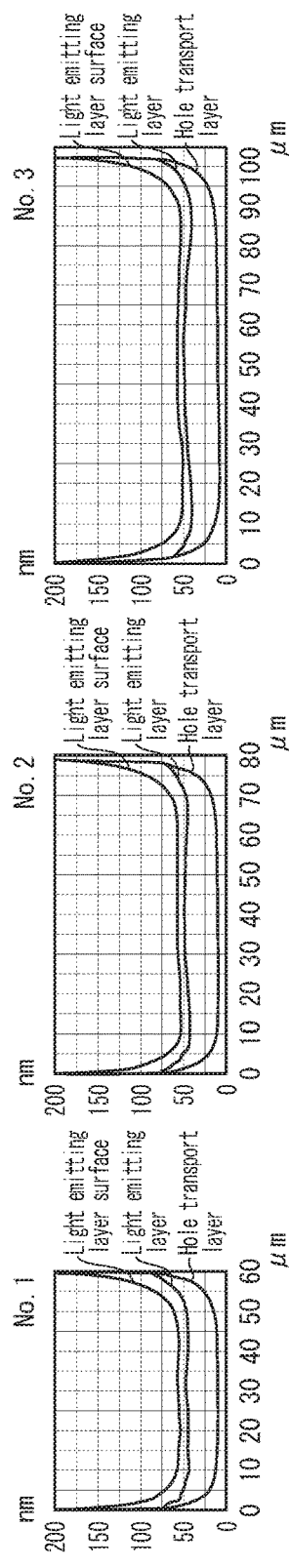
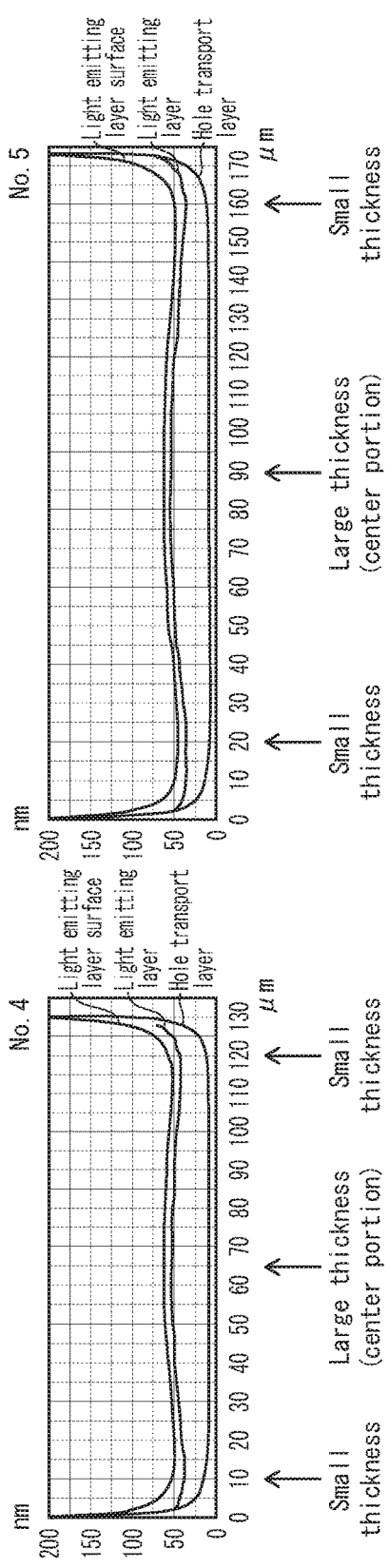

ORGANIC LIGHT EMITTING DEVICE AND METHOD FOR MANUFACTURING SAME

CROSS REFERENCE TO RELATED APPLICATIONS

This application is a Continuation of U.S. patent application Ser. No. 15/301,797, filed Oct. 4, 2016, which is a U.S. National Stage Entry under 35 U.S.C. § 371 of International Application No. PCT/JP2015/001910, filed Apr. 3, 2015, which in turn claims the benefit of Japanese Application No. 2014-079330, filed Apr. 8, 2014. The disclosure of each of these documents, including the specification, drawings, and claims, is incorporated herein by reference in its entirety.

TECHNICAL FIELD

The present invention relates to an organic light emitting device and, more particularly, to an organic light emitting device in which a functional layer of a light emitting element is formed by applying ink to a groove region defined by banks.

BACKGROUND ART

In recent years, as light emitting display devices, organic EL devices have been put to practical use, in which a plurality of organic EL elements are arranged in a column direction and a row direction in a matrix on a substrate. In such organic EL devices, the organic EL elements are self-luminous, and therefore visibility is high, and entirely solid-state, and therefore impact resistance is excellent.

In an organic EL device, each organic EL element typically has a structure in which a light emitting layer that includes an organic light emitting material is disposed between an anode and cathode pair of electrodes. When driven, a voltage is applied between the pair of electrodes, holes are injected to the light emitting layer from the anode, electrons are injected to the light emitting layer from the cathode, and the holes and the electrons recombine to emit light. In an organic EL device of a full-color display, such organic EL elements form RGB sub-pixels, a single pixel being formed from a combination of adjacent RGB sub-pixels.

In the organic EL device, a light emitting layer of an organic EL element is typically separated from adjacent light emitting layers of organic EL elements by banks composed of an insulative material. Further, between the anode and the light emitting layer, a hole injection layer, a hole transport layer, or a hole injection and transport layer are interposed as required, and between the cathode and the light emitting layer, an electron injection layer, an electron transport layer, or an electron injection and transport layer are interposed as required. Layers such as a hole injection layer, a hole transport layer, a hole injection and transport layer, an electron injection layer, an electron transport layer, and an electron injection and transport layer are collectively referred to as functional layers.

A method of manufacturing such an organic EL device, as disclosed in Patent Literature 1, includes forming, on a substrate, a plurality of stripe-shaped banks extending in a column direction, and forming a functional layer in a groove region defined by banks. In many cases, the functional layer is formed by a wet method of applying light emitting layer forming ink containing a high-molecular material or a low molecule having a superior capability to form a thin film, to the groove region by an inkjet method. According to this wet method, an organic layer and a light emitting layer can be formed in a large-size panel relatively easily.

Furthermore, in addition to the banks in the column direction, banks in a row direction orthogonal to the column banks are formed on the substrate to define pixel regions adjacent to each other in the column direction in some cases.

Thus, the ink for forming the functional layer is sequentially applied to the entire groove region between the line banks formed on the substrate, so that the functional layer having relatively uniform thickness can be formed in the groove region along its extending direction.

CITATION LIST

Patent Literature

Patent Literature 1

Japanese Patent Application Publication No. 2007-234232

SUMMARY OF INVENTION

Technical Problem

In the above organic light emitting device, an opening width of the groove region defined by the banks extending in the column direction is set large in some cases. For example, a blue light emitting element is more likely to be degraded than other light emitting elements, so that in order to prevent the degradation, the width of the groove region for the blue light emitting element is set larger than widths of the groove regions for the other light emitting elements to reduce a current density flowing in the blue light emitting element in some cases.

Here, in the groove region having the large opening width, the functional layer formed by applying the ink to the groove region is not uniform in thickness distribution in some cases. Thus, when the thickness of the functional layer is not uniform in the light emitting element and there is a large difference in thickness, a current density is increased in a region having the small thickness at the time of driving, which may cause the element to be degraded.

In view of the above problems, it is an object of the present invention to provide an organic light emitting device in which light emitting elements are arranged in a groove region defined by a plurality of banks, the organic light emitting device having a functional layer with uniform thickness distribution by reducing a difference in thickness of the functional layer in the light emitting element.

Solution to Problem

An organic light emitting device pertaining to one aspect of the present invention is an organic light emitting device comprising: a base substrate; a plurality of column banks extending in one direction along a surface of the base substrate; and a plurality of light emitting elements extending along the one direction in a plurality of groove regions defined by the plurality of column banks, wherein each of the light emitting elements has one or more functional layers sandwiched between a pair of electrodes, within at least one of the groove regions: a sub-bank extends along the one direction and has a height equal to or smaller than a height of the column banks, and for each of the one or more functional layers therein, portions thereof on either side of the sub-bank are made of the same material.

Here, the portions of one functional layer existing in both groove region portions may be connected to or disconnected from each other on the sub-bank.

Advantageous Effects of Invention

With the organic light emitting device according to the above aspect, the one or more sub-banks are formed in at least one of the plurality of groove regions each defined by the plurality of column banks in a bank-formed substrate, and the functional layer formed in each of the plurality of light emitting elements arranged in that groove region is provided spanning the groove region portions on both sides across the sub-bank. Therefore, even when an opening width of the groove region in which the sub-bank is present is large, each of the groove region portions defined by the sub-bank has a small opening width.

Here, when the groove width of the groove region is small, the thickness distribution in the functional layer formed in the groove region by the wet method can be uniform. Therefore, the thickness distribution of the functional layer can be uniform in the light emitting element spanning the sub-bank.

Thus, when the thickness distribution of the functional layer can be uniform in the light emitting element, a current density distribution can be uniform in the light emitting element, so that a life of the light emitting element can be elongated. Furthermore, brightness unevenness is not likely to be generated in each light emitting element.

BRIEF DESCRIPTION OF DRAWINGS

FIG. 8A is a graph showing an experiment result regarding a thickness distribution of a functional layer formed in a groove region in a bank-formed substrate of No. 1. FIG. 8B is a graph showing an experiment result regarding a thickness distribution of a functional layer formed in a groove region in a bank-formed substrate of No. 2. FIG. 8C is a graph showing an experiment result regarding a thickness distribution of a functional layer formed in a groove region in a bank-formed substrate of No. 3. FIG. 8D is a graph showing an experiment result regarding a thickness distribution of a functional layer formed in a groove region in a bank-formed substrate of No. 4. FIG. 8E is a graph showing an experiment result regarding a thickness distribution of a functional layer formed in a groove region in a bank-formed substrate of No. 5.

DESCRIPTION OF EMBODIMENTS

Background of the Invention

Figure 1:
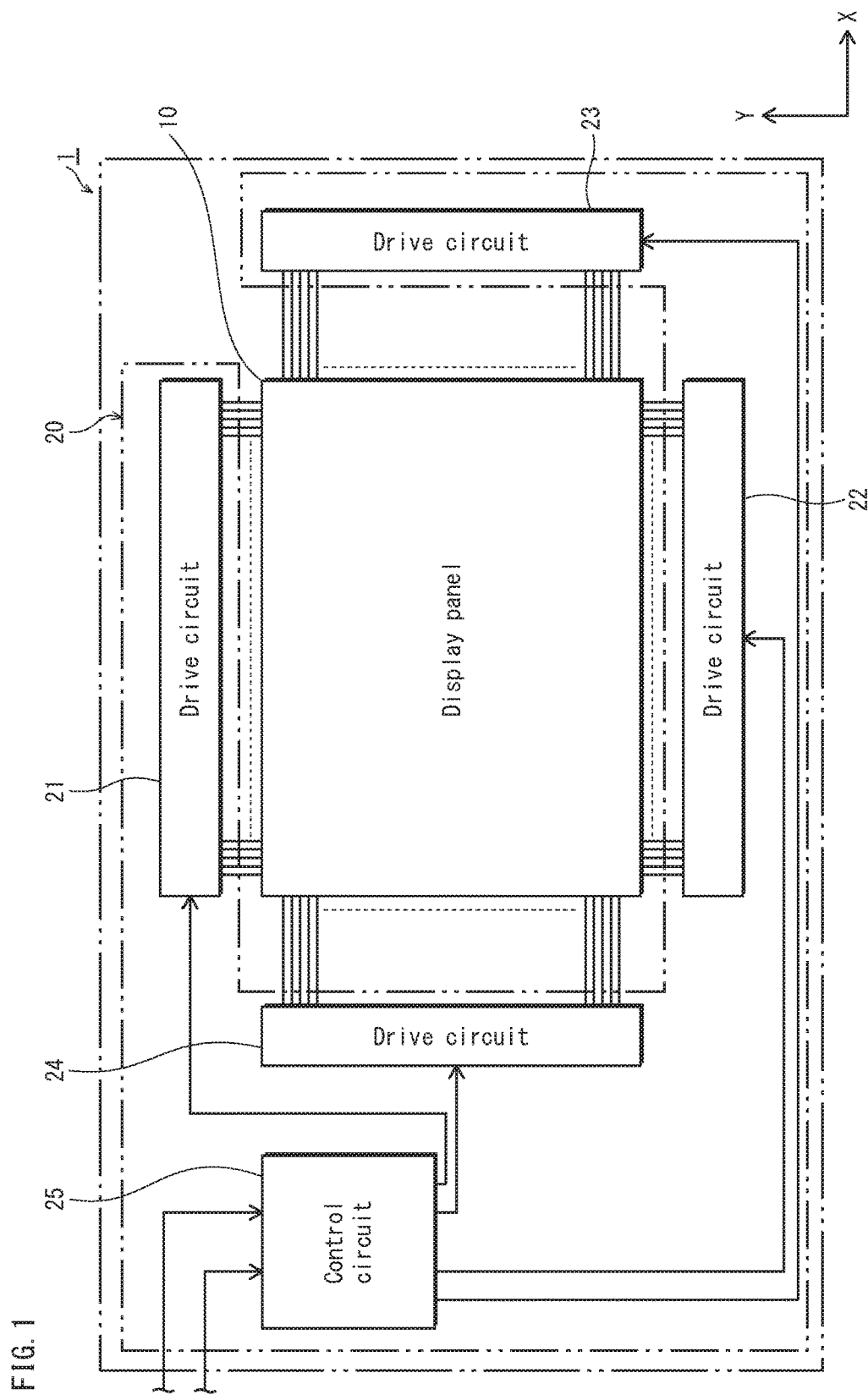
FIG. 1 is a schematic block diagram illustrating a rough configuration of an organic EL display device 1 according to an embodiment.

The inventor of the present invention has found that in manufacturing an organic light emitting device in which a plurality of light emitting elements are arranged in each of a plurality of groove regions defined by a plurality of banks extending along a surface of a base substrate, when a functional layer is formed by applying ink to each groove region, there is a correlation between unevenness in thickness of the functional layer formed in the light emitting element, and an opening width of the groove region.

It has been found that in a case where the opening width of the groove region is equal to or less than 80 μm, the thickness of the light emitting layer is relatively uniform in the groove region, while in a case where the opening width of the groove region is more than 80 μm, there is a large difference in thickness of the light emitting layer between a center portion and a vicinity of an end portion in the groove region. The detailed description thereof will be given in "a relationship between the size of the opening width of the groove region and the thickness distribution of the functional layer" below.

The reason is considered as follows.

An ink layer which has been formed by applying ink to the groove region has a raised shape in the center portion of the groove due to surface tension.

In a process of drying the ink layer, according to a phenomenon known as the coffee stain effect, the ink layer is dried faster in both end portions than in the center portion, which causes ink flow from the center portion to the end portions of the ink layer.

A shape of the functional layer after the drying process depends on how much its functional material is dispersed due to the ink flow from the center portion to both the end portions. That is, when the ink flow is not sufficient in the ink layer, the raised shape in the center portion is reflected in a final shape of the functional layer and the thickness is larger in the center portion, but when the ink flow is sufficient from the center portion to both the end portions in the ink layer, the thickness of the functional layer to be formed is reduced in the center portion and increased in both the end portions.

Thus, when the opening width of the groove region is small, a distance between the center portion and both the end portions is small in the ink layer, so that the uniform thickness can be easily provided between the center portion and both the end portions due to the ink flow, but when the opening width of the groove region is large, a distance between the center portion and both the end portions is large, so that the uniform thickness cannot be attained because the ink flow is not sufficient in the center portion, and the center portion is likely to be slightly raised.

The present invention has been made based on the above findings.

The bank is typically provided to separate the adjacent light emitting elements, and not provided in the light emitting element, but the inventor of the present invention proposed providing a sub-bank in the groove region defined by the banks in a bank-formed substrate.

Thus, the inventor has come up with the idea that the thickness of the functional layer can be more uniform by providing the sub-bank to define the region for the light emitting element to reduce the opening width of the groove region to which the ink is applied for forming the functional layer.

Aspect of Invention

An organic light emitting device pertaining to one aspect of the present invention is an organic light emitting device comprising: a base substrate; a plurality of column banks extending in one direction along a surface of the base substrate; and a plurality of light emitting elements extending along the one direction in a plurality of groove regions defined by the plurality of column banks, wherein each of the light emitting elements has one or more functional layers sandwiched between a pair of electrodes, within at least one of the groove regions: a sub-bank extends along the one direction and has a height equal to or smaller than a height of the column banks, and for each of the one or more functional layers therein, portions thereof on either side of the sub-bank are made of the same material.

With the organic light emitting device according to this aspect, even when the groove region in which the sub-bank is formed has a large width, a width of the groove region portion defined by the sub-bank can be small, so that the functional layer formed by the wet method can be uniform in thickness. Therefore, the thickness of the functional layer can be uniform in the light emitting element, so that degradation is not likely to be generated at the time of driving, which contributes a long life of the light emitting element. Furthermore, brightness unevenness is not likely to be generated in the light emitting element.

The organic light-emitting device of the aspect described above may be configured as follows.

The sub-bank is continuous from one end to another end of each light-emitting element along the one direction.

An upper end of the sub-bank is closer to the surface of the base substrate than an upper end of each of the column banks.

The column bank is normally required to have a certain height and a liquid-repelling property in order to separate the light emitting elements having the functional layers made of different materials, but since the sub-bank is provided to separate the functional layer in the light emitting element unlike the normal column bank, the functional layer made of the same material exists across the sub-bank. Therefore, an upper end of the sub-bank may be closer to the base substrate than an upper end of the column bank, and is actually preferably closer to the base substrate than the upper end of the column bank.

A plurality of row banks are in each of the groove regions, partitioning functional layers of light emitting elements that are adjacent to each other in the one direction.

Thus, the thickness of the functional layer can be uniform among the plurality of light emitting elements arranged in the groove region.

An upper end of the each of the row banks is closer to the surface of the base substrate than the upper end of each of the column banks.

A pixel electrode is disposed on the base substrate under the one or more functional layers of each of the light emitting elements, and each pixel electrode disposed under the one or more functional layers in the at least one of the groove regions in which the sub-bank is present spans the portions of the one or more functional layers therein.

Each of the at least one of the groove regions in which the sub-bank is present has a groove width of 80 μm or more, and each portion of the at least one of the groove regions on either side of the sub-bank has a width of 80 μm or more.

The plurality of groove regions has small and large groove widths, and the sub-bank is disposed at least in a groove region having the largest groove width among the groove widths.

A method for forming a functional layer pertaining to an aspect of the present invention includes preparing a bank-formed substrate that includes a base substrate and a plurality of banks extending in one direction along a surface of the base substrate, applying ink for forming a functional layer of a light emitting element to each of a plurality of groove regions defined by the plurality of banks in the bank-formed substrate, and drying the ink, the method comprising: prior to the application of the ink to the bank-formed substrate, forming one or more sub-banks extending along the one direction, in at least one of the plurality of groove regions; and in applying the ink to the at least one of the groove regions in which the sub-bank is formed, applying the ink to either side of the sub-bank.

With the method for forming the functional layer according to this aspect, even when the groove region in which the sub-bank is formed has a large width, a width of the groove region portion defined by the sub-bank can be small, so that the functional layer formed by applying the ink for forming the functional layer can be uniform in thickness. Therefore, the thickness distribution of the functional layer can be uniform in the light emitting element, so that degradation is not likely to be generated in the light emitting element at the time of driving. Furthermore, brightness unevenness is not likely to be generated in the light emitting element.

The sub-bank may have a lower liquid-repelling property against the ink for forming the functional layer than the bank.

As a result, ink wettability to the sub-bank can be enhanced, and ink adherability to the sub-bank can be enhanced.

In applying the ink to the at least one of the groove regions in which the sub-bank is formed, the ink is applied covering the sub-bank.

A method for manufacturing an organic light emitting device pertaining to an aspect of the present invention includes forming a functional layer on a base substrate, the method comprising: implementing the method described above for forming the functional layer.

EMBODIMENT

The following describes a configuration and method of manufacture of an organic EL device pertaining to an embodiment.

1. Schematic Configuration of Device

Figure 2:
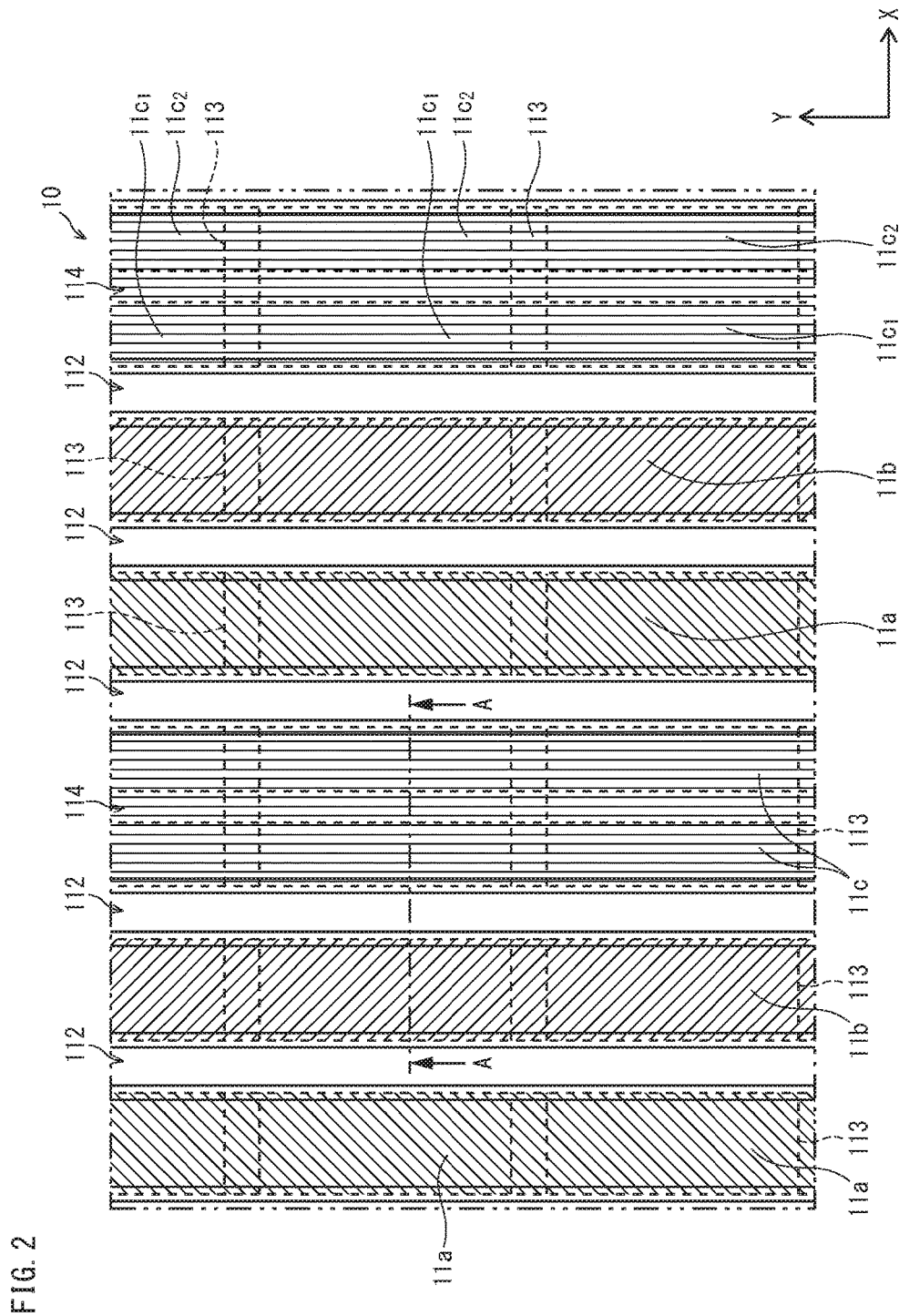
FIG. 2 is a schematic plan view illustrating a layout configuration of subpixels 11*a*, 11*b*, and 11*c* in a display panel 10.

Referring to FIG. 1 and FIG. 2, a schematic configuration of an organic EL display device 1 is described.

As shown in FIG. 1, the organic EL display device 1 includes a display panel 10 and drive/control circuitry 20 connected thereto. The display panel 10 is a type of organic light emitting device, and is an organic EL panel that uses electroluminescence of an organic material.

As shown in FIG. 2, the display panel 10 includes a plurality of light emitting elements 11a, 11b, 11c in a two-dimensional arrangement in an X direction and a Y direction. In the display panel 10, as one example, the light emitting element 11a emits red (R) light, the light emitting element 11b emits green (G) light, and the light emitting element 11c emits blue (B) light. Three light-emitting elements 11a, 11b, 11c that are adjacent in the X direction constitute one pixel.

As shown in FIG. 1, the drive/control circuitry 20 in the organic EL display device 1 includes four drive circuits 21, 22, 23, 24 and one control circuit 25.

FIG. 2 shows an example in which three light emitting elements 11a, 11b, 11c constitute one pixel, but pixel configuration is not limited to this example and four or more light emitting elements may constitute one pixel.

2. Configuration of Display Panel 10

Figure 5:
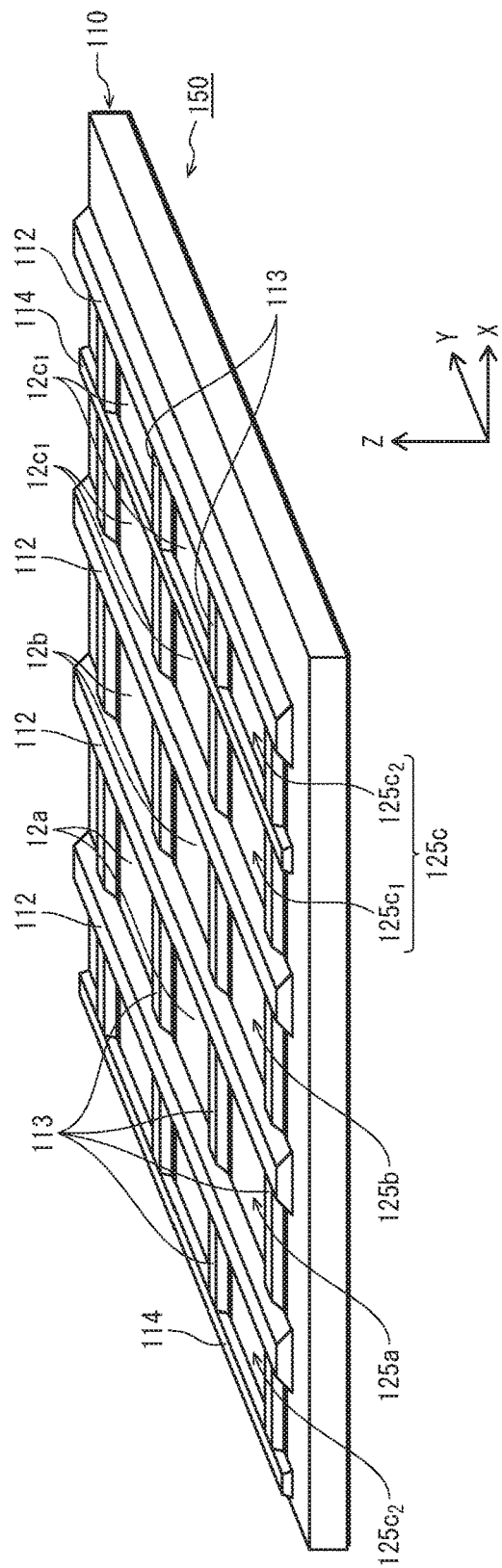
FIG. 5 is a schematic perspective view of a bank-formed substrate 150.

As illustrated in FIG. 2, the display panel 10 includes the plurality of light emitting elements 11a to 11c arranged in a two dimensional manner. As illustrated in FIG. 2, each of the light emitting elements 11a to 11c exists in each of rectangular subpixel regions defined by a plurality of column banks (line banks) 112 extending in the Y direction, and a plurality of row banks 113 formed between the column banks 112 and spaced apart in the Y direction. In addition, reference signs 12a, 12b, and 12c in FIG. 5 represent the subpixel regions corresponding to the light emitting elements 11a, 11b, and 11c, respectively.

Figure 3:
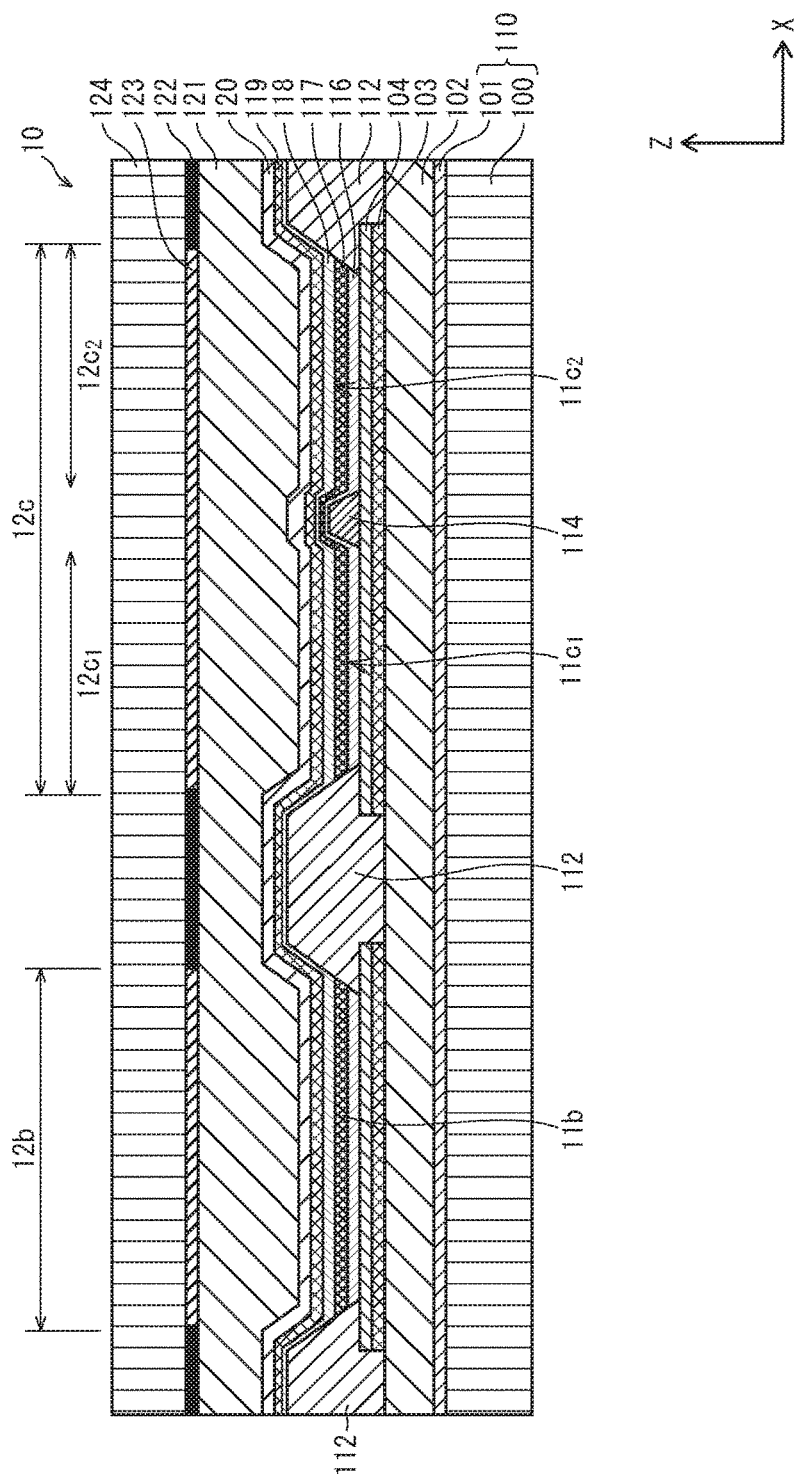
FIG. 3 is a schematic cross-sectional view illustrating a configuration taken along line A-A in FIG. 2.

FIG. 3 is a schematic cross-sectional view taken along line A-A in FIG. 2.

The display panel 10 has a TFT substrate 110 serving as a base and including a substrate 100 and a TFT layer 101 formed on the substrate 100. The TFT layer 101 includes three electrodes of a gate, a source, and a drain, a semiconductor layer, and a passivation film, which are not illustrated in the drawings.

An interlayer insulating layer 102 is laminated on the TFT substrate 110.

The interlayer insulating layer 102 has a substantially flat upper surface, and light emitting elements 11a to 11c are formed thereon.

Each of the light emitting elements 11a to 11c has the same basic configuration and includes a pixel electrode 103, a hole injection layer 104, a hole transport layer 116, a light emitting layer 117, an electron transport layer 118, and a cathode 119 which are sequentially formed on the interlayer insulating layer 102.

The column bank 112 is formed on the interlayer insulating layer 102 to cover both X-directional edges of the hole injection layer 104.

The hole transport layer 116 and the light emitting layer 117 are formed and laminated between the column banks 112.

In addition, the hole transport layer 116 and the light emitting layer 117 are formed to be continuous in the Y direction.

Furthermore, the electron transport layer 118, the cathode 119, and a sealing layer 120 are sequentially formed so as to wholly cover an upper surface of the light emitting layer 117, and a side surface and a top surface of the column bank 112.

The sealing layer 120 has a function of preventing the organic layer such as the light emitting layer 117 from being exposed to water or exposed to air.

A substrate 124 having a black matrix layer 122 and a color filter layer 123 is laminated on the sealing layer 120 with a resin layer 121 interposed between the substrate 124 and the sealing layer 120.

The display panel 10 having the above configuration is of a top-emission type and emits light in a Z direction.

Here, it is to be noted that as illustrated in FIGS. 2 and 3, the blue light emitting element 11c has an X-directional width (subpixel width) set larger than those of the red light emitting element 11a and the green light emitting element 11b.

In general, blue light emitting elements are more likely to be degraded at a time of driving than red light emitting elements and green light emitting elements, but by setting the large width for the blue light emitting element 11c, a current density is reduced, so that the degradation can be prevented.

Thus, a sub-bank 114 extending in the Y direction is formed in a center portion of a groove region 125c for the blue light emitting element 11c, and the blue light emitting element 11c is divided into two light emitting element portions 11c1 and 11c2 provided on both sides of the sub-bank 114.

The pixel electrode 103 is formed on the interlayer insulating layer 102 and provided separately to each of the light emitting elements 11a to 11c. The pixel electrode 103 is connected to an upper electrode (an electrode connected to the source or drain) of the TFT layer 101 through a contact hole (not illustrated) provided in the interlayer insulating layer 102.

As illustrated in FIG. 3, the pixel electrode 103 of the blue light emitting element 11c is formed spanning the two light emitting element portions 11c1 and 11c2 under the sub-bank 114, and the light emitting element portion 11c1 and the light emitting element portion 11c2 serve as one light emitting element when the display panel 10 is driven.

The pixel electrode of the blue light emitting element 11c may be divided and formed in each of the light emitting element portion 11c1 and the light emitting element portion 11c2, but the two divided pixel electrodes need to be electrically connected so that the light emitting element portion 11c1 and the light emitting element portion 11c2 can serve as one light emitting element.

As illustrated in FIGS. 2 and 3, the functional layers (the hole transport layer 116 and the light emitting layer 117) of the blue light emitting element 11c are formed in each of the two light emitting element portions 11c1 and 11c2 provided on both sides across the sub-bank 114.

The row bank 113 and the sub-bank 114 project from the hole injection layer 104, and the sub-bank 114 intersects with the plurality of row banks 113 in the groove region 125c.

Here, heights of the row bank 113 and the sub-bank 114 (distances from a surface of the TFT substrate 110) are set to be equal or smaller than a height of the column bank 112, and they are preferably set to be some extent smaller than the height of the column bank 112.

(Details and Effects of Sub-Bank 114)

FIG. 5 is a schematic perspective view of a bank-formed substrate 150 in which the column bank 112, the row bank 113, and the sub-bank 114 are formed on a base substrate including the substrate 100 and the interlayer insulating layer 102.

As illustrated in FIG. 5, in the bank-formed substrate 150, the plurality of row banks 113 are formed crossing the groove region 125 defined by the column banks 112, and the sub-bank 114 extends in the Y direction in the blue groove region 125c. Thus, the blue groove region 125c is divided by the sub-bank 114 into a groove region portion 125c1 and a groove region portion 125c2. Here, an opening width of the blue groove region 125c exceeds 80 µm, and an opening width of each of the groove region portions 125c1 and 125c2 is set equal to or less than 80 µm.

The hole transport layer 116 and the light emitting layer 117 of the blue light emitting element 11c are formed in each of the groove region portion 125c1 and the groove region portion 125c2 divided by the sub-bank 114.

The sub-bank 114 is not necessarily formed in a center of the groove region 125c, but the sub-bank 114 is preferably formed in the center of the groove region 125c parallel to the column bank 112 so that the groove width can be equal between the groove region portion 125c1 and the groove region portion 125c2.

Furthermore, the sub-bank 114 is provided so that the hole transport layer 116 and the light emitting layer 117 are formed in each of the two groove region portions. Therefore, although the sub-bank 114 is not always required to be continuous from one end to the other end of the blue light emitting element 11c along the Y direction, it is preferably formed to be continuous without interruption along the Y direction.

In addition, as for the extending direction of the sub-bank 114, it is not necessarily parallel to the column bank 112, and it only needs to be along the column bank 112.

Here, when the sub-bank 114 is formed in the groove region 125c, an area of a blue subpixel is reduced by a width of the sub-bank 114 and an aperture rate is lowered, so that it is desirable that the width of the sub-bank 114 is as small as possible. However, in view of manufacturing technique, there is a limit to how small the width can be, and it is difficult to manufacture a bank width equal to or less than 10 µm.

As described above, the hole transport layer 116 and the light emitting layer 117 of the blue light emitting element 11c are formed in each of the groove region portion 125c1 and groove region portion 125c2, and the opening width of each groove region is as small as 80 µm or less, so that the hole transport layer 116 and the light emitting layer 117 can be uniform in thickness in the subpixel region.

When the opening width of the groove region is set as small as 80 µm or less, the functional layer can be uniform in thickness in the subpixel region. This is confirmed by a result of "5. Experiment regarding opening width of groove region and thickness distribution of functional layer" (see FIGS. 8 and 9) which will be described below.

When there is a large difference in thickness in the thickness distribution of the functional layer in the light emitting element 11, a current density is increased in a region having the small thickness, which causes the light emitting element 11 to be degraded early, however, as described above, when the functional layers (the hole transport layer 116 and the light emitting layer 117) have the uniform thicknesses in the subpixel region in the blue light emitting element 11c, a longer life can be expected. Furthermore, brightness unevenness can be prevented from being generated in the pixel of the display panel 10, which can provide an effect of improving the display performance of the display panel 10.

3. Component Materials of Display Panel 10

Substrate 100:

The substrate 100 is formed by using, for example, a glass substrate, a silica glass substrate, a metal substrate such as molybdenum sulfide, copper, zinc, aluminium, stainless steel, magnesium, iron, nickel, gold, or silver, a semiconductor substrate based on gallium arsenide, or a plastic substrate.

As a plastic substrate, any thermoplastic or thermosetting resin may be used.

For example, the plastic substrate may be a polyolefin such as polyethylene, polypropylene, ethylene-propylene copolymer, ethylene-vinyl acetate copolymer (EVA), etc., cyclic polyolefin, modified polyolefin, polyvinyl chloride, polyvinylidene chloride, polystyrene, polyamide, polyimide (PI), polyamide-imide, polycarbonate, poly-(4-methyl-1-pentene), ionomer, acrylic resin, polymethyl methacrylate, acryl-styrene copolymer (AS resin), butadiene-styrene copolymer, ethylene vinyl alcohol (EVOH) copolymer, polyethelene terephthalate (PET), polybutylene terephthalate, polyethylene naphthalate (PEN), polyester such as polycyclohexylenedimethylene terephthalate (PCT), polyether, polyether ketone, polyether sulfone (PES), polyetherimide, polyacetal, polyphenylene oxide, modified polyphenylene oxide, polyarylate, aromatic polyester (liquid crystal polymer), polytetrafluoroethylene, polyvinylidene fluoride, another fluorine-based resin, various thermoplastic elastomers such as styrene-based, polyolefin-based, polyvinyl chloride-based, polyurethane-based, or fluororubber-based thermoplastic elastomers, epoxy resin, phenolic resin, urea resin, melamine resin, unsaturated polyester, silicone resin, polyurethane, etc., or a copolymer, blend, polymer alloy, etc., that primarily comprises one of the above. Further, a layered body may be used in which one or more of the materials above may be used in one or more layers.

Interlayer Insulating Layer 102:

In manufacturing the display panel 10, an etching process, a baking process, etc., are implemented, and therefore the interlayer insulating layer 102 is preferably formed from a material that is resistant to such processes. The interlayer insulating layer 102 is, for example, formed from an organic compound such as polyimide, polyamide, or acrylic resin.

Pixel Electrode 103:

The display panel 10 is a top-emission type, and therefore a surface of the pixel electrode 103 preferably has high reflectivity. The pixel electrode is formed from a metal material including silver (Ag) or aluminium (Al).

The pixel electrode 103 can be a layered body including a metal layer and a light-transmissive electrically-conductive layer instead of a single layer structure made from a metal material. As the light-transmissive electrically-conductive layer, indium tin oxide (ITO) or indium zinc oxide (IZO) may be used, for example.

Hole Injection Layer 104:

The hole injection layer 104 is formed from an oxide of a metal such as silver (Ag), molybdenum (Mo), chromium (Cr), vanadium (V), tungsten (W), nickel (Ni), or iridium (Ir), or an electrically conductive polymer such as poly(3, 4-ethylenedioxythiophene) polystyrene sulfonate (PEDOT: PSS).

Column Bank 112:

Material of the column bank 112 may be the same as the material of the row bank 113, or different.

The column bank 112 preferably has liquid repellency with respect to ink used in wet methods that form the hole transport layer 116 and the light emitting layer 117. Accordingly, material of the column bank 112 is preferably a fluorine resin.

Structure of the column bank 112 may be a multi-layered structure of two or more layers instead of a single layer structure. In the case of a multi-layered structure, the material described above may be combined in each layer.

Row Bank 113

The row bank 113 is formed from a photosensitive organic material. Specific examples of such an organic material include acrylic resin, polyimide resin, siloxane resin, and phenolic resin.

However, material of the row bank 113 is not limited to organic material, and may be an inorganic insulating material such as silicon oxide ($SiO_2$), silicon nitride (SiN), and silicon oxynitride (SiON).

Sub-Bank 114:

The sub-bank 114 is formed from a photosensitive organic material. Specific examples of such an organic material include acrylic resin, polyimide resin, siloxane resin, and phenolic resin.

The row bank 113 and the sub-bank 114 may be formed from the same material at the same time.

Further, the row bank 113 and the sub-bank 114, when compared to the column bank 112, preferably have a lower liquid repellency with respect to ink that forms the hole transport layer 116 and the light emitting layer 117.

Adjusting liquid repellency of the row bank 113 and the sub-bank 114 can be performed by adjusting bank material used or by adjusting UV processing conditions used thereon.

Hole Transport Layer 116:

The hole transport layer 116 can be formed by using, for example, a high molecular compound such as polyfluorene, a derivative thereof, polyarylamine, or a derivative thereof.

Light Emitting Layer 117:

As a material of the light emitting layer 117, a phosphorescent material is used, such as polyphenylene vinylene (PPV), polyfluorene, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or a rare earth complex.

Electron Transport Layer 118:

The electron transport layer 118 is formed using, for example, an oxadiazole derivative (OXD), a triazole derivative (TAZ), or a phenanthroline derivative (BCP, Bphen).

Cathode 119:

The display panel 10 is a top-emission type, and therefore the cathode 119 is formed from a light-transmissive material. Specific examples of material include indium tin oxide (ITO) and indium zinc oxide (IZO).

Sealing Layer 120:

The sealing layer 120 is formed from a light-transmissive material.

Material of the sealing layer 120 is, for example, silicon nitride (SiN) or silicon oxynitride (SiON). Further, on a layer formed from a material such as silicon nitride (SiN) or silicon oxynitride (SiON), a sealing resin layer composed of resin material such as acrylic resin or silicone resin may be provided.

Resin Layer 121:

The resin layer 121 is formed from a light-transmissive resin material such an epoxy resin material. However, an alternative material may be used such as silicone resin.

Black Matrix Layer 122:

The black matrix layer 122 is formed from an ultraviolet curing resin material that includes black pigment that has excellent light absorption and light-shielding properties. As an ultraviolet curing resin material, an acrylic-type of ultraviolet curing resin material is used.

Color Filter Layer 123

The color filter layer 123 is formed from a material that selectively transmits visible light in a wavelength range of each of red (R), green (G), and blue (B) colors; for example, a material based on a known acrylic resin.

Substrate 124:

The substrate 124 is formed similarly to the substrate 100 by using, for example, a glass substrate, a silica glass substrate, a metal substrate such as molybdenum sulfide, copper, zinc, aluminium, stainless steel, magnesium, iron, nickel, gold, or silver, a semiconductor substrate based on gallium arsenide, or a plastic substrate.

4. Method for Manufacturing Display Panel 10

Figure 4:
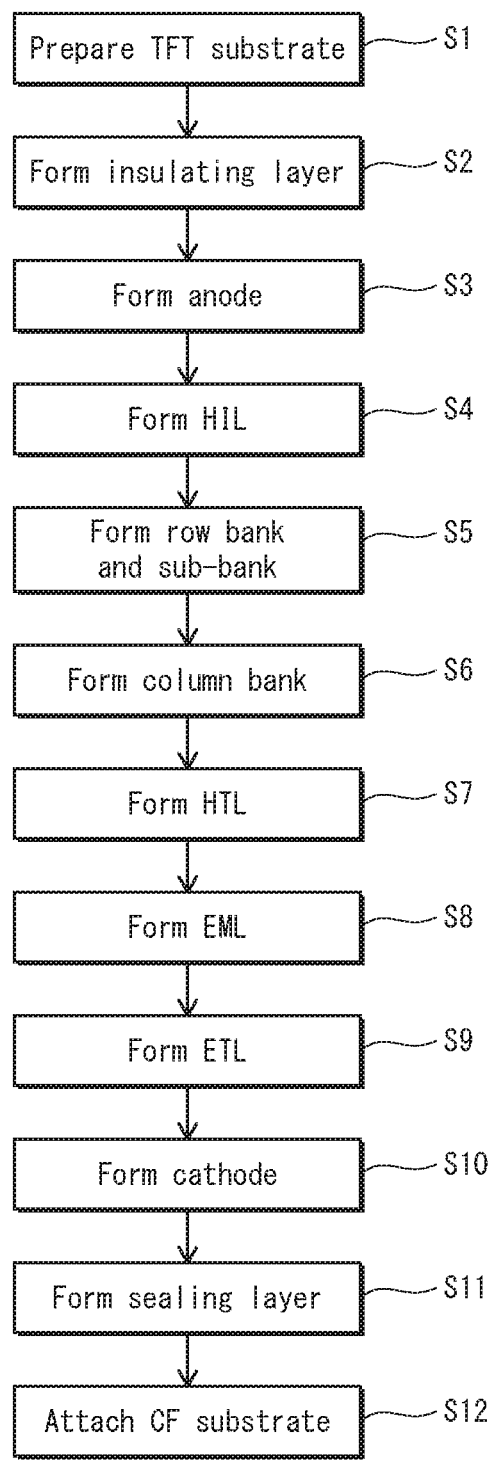
FIG. 4 is a flowchart illustrating manufacturing steps of the display panel 10.

The method for manufacturing the display panel 10 will be described with reference to the flowchart of FIG. 4.

In manufacturing the display panel 10, first, the TFT substrate is prepared (step S1). The TFT substrate is manufactured by forming the TFT layer 101 on the upper surface of the substrate 100, using a publicly known technique.

Subsequently, the interlayer insulating layer 102 is formed by applying the organic material on the TFT substrate (step S2).

Thus, the TFT substrate and the interlayer insulating layer 102 formed thereon are used as the base substrate, and the pixel electrode 103 and the hole injection layer 104 are sequentially laminated on the interlayer insulating layer 102 (steps S3 and S4). The pixel electrode 103 is formed such that a metal film is formed by a sputtering method or a vacuum deposition method and then patterned by a photolithography method and an etching method.

The hole injection layer 104 is formed such that a film is formed of metal oxide (such as tungsten oxide) by a sputtering method and then patterned by a photolithography method and an etching method.

Subsequently, the row bank 113 and the sub-bank 114 are formed (step S5).

Figure 6A:
FIG. 6A illustrates a step of applying a bank material in a step of forming a bank.
Figure 6B:
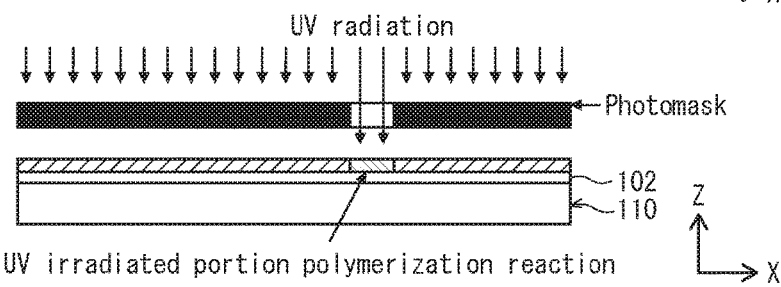
FIG. 6B illustrates an exposing step, in the step of forming the bank.
Figure 6C:
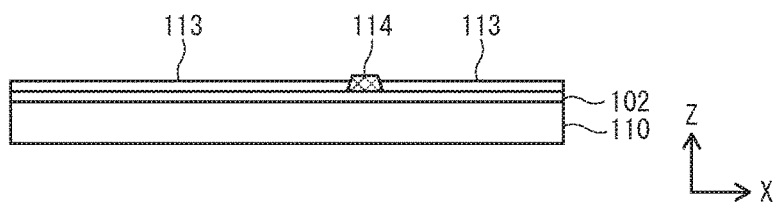
FIG. 6C illustrates a developing step in the step of forming the bank.

FIGS. 6A to 6C illustrate the steps of forming the row bank 113 and the sub-bank 114.

Here, the row bank 113 and the sub-bank 114 are collectively formed of the same material.

As illustrated in FIG. 6A, the row bank 113 and the sub-bank 114 are formed by uniformly applying a bank material (a photosensitive photoresist material) to the hole injection layer 104.

After that, as illustrated in FIG. 6B, a bank material layer formed in the above step is irradiated with UV light through a photomask having openings corresponding to patterns of the row bank 113 and the sub-bank 114. Then, as shown in FIG. 6C, the uncured unnecessary bank material is removed with a developing solution, whereby the row bank 113 and the sub-bank 114 are formed. The row bank 113 and the sub-bank 114 have the same height (a distance from the surface of the TFT substrate).

Figure 6D:
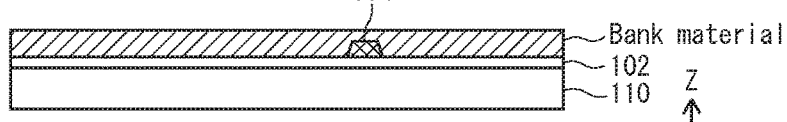
FIG. 6D illustrates a step of applying a bank material in a step of forming a bank.
Figure 6E:
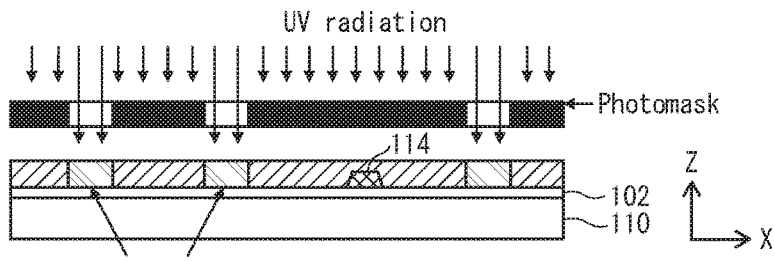
FIG. 6E illustrates an exposing step in the step of forming the bank.
Figure 6F:
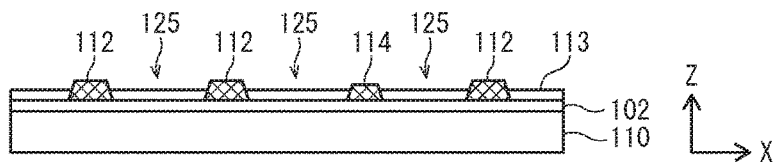
FIG. 6F illustrates a developing step in the step of forming the bank.

Subsequently, the column bank 112 is formed as follows (step S6). FIGS. 6D to 6F illustrate the steps of forming the column bank 112.

As illustrated in FIG. 6D, the column bank 112 is formed by uniformly applying a bank material (a negative type photosensitive resin composition) to the substrate on which the row bank 113 and the sub-bank 114 have been formed. As illustrated in FIG. 6E, a bank material layer formed in the above step is exposed to light through a photomask having openings corresponding to a pattern of the column bank 112.

After that, as illustrated in FIG. 6F, the bank material is patterned by removing the unnecessary bank material with an alkali developing solution, whereby the column bank 112 is formed.

As illustrated in FIG. 5, the plurality of groove regions 125 are defined by the plurality of column banks 112 and formed in the Y direction on the upper surface side of the bank-formed substrate 150, and the groove regions 125 are partitioned by the row banks 113, forming the plurality of subpixel regions 12 (12a, 12b, and 12c).

Subsequently, the hole transport layer 116 is formed in the groove region 125 defined by the column banks 112 (step S7). The hole transport layer 116 is formed by a wet method in which ink containing a constituent material of the hole transport layer 116 is applied to the groove region formed between the adjacent column banks 112 and then baked.

Similarly, the light emitting layer 117 is formed on the groove region 125 defined by the column banks 112 (step S8). The light emitting layer 117 is formed similarly by the above method in which ink containing a constituent material is applied and baked.

In addition, the steps of forming the hole transport layer 116 and the light emitting layer 117 will be described more in detail below.

Subsequently, the electron transport layer 118, the cathode 119, and the sealing layer 120 are sequentially laminated so as to cover the upper surfaces of the light emitting layer 117 and the column bank 112 (steps S9, S10, and S11). The electron transport layer 118, the cathode 119, and the sealing layer 120 are formed by a method such as vacuum deposition method or sputtering method.

Thus, the display panel 10 is completed by laminating a color filter substrate formed such that the color filter layer 123 and the black matrix layer 122 are formed on the substrate 124 (step S12).

Dimensions of the completed column bank 112, row bank 113, and light emitting elements 11a to 11c are shown below.

A height of the column bank 112 (a height from an upper surface of the interlayer insulating layer 102) is 1 µm and a width thereof is 30 µm.

Heights of the row bank 113 and the sub-bank 114 (heights from the upper surface of the interlayer insulating layer 102) are 0.5 µm, and widths of them are 15 µm to 20 µm.

A length of each of the light emitting elements 11a, 11b, and 11c in the Y direction is 300 µm.

(Step of Forming the Hole Transport Layer 116)

The hole transport layer 116 is formed such that the ink for forming the hole transport layer is applied to and dried in the groove region 125 in the bank-formed substrate 150 illustrated in FIG. 5.

Figure 7A:
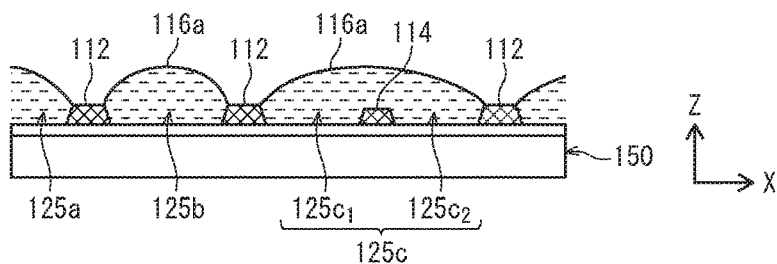
FIG. 7A is a schematic cross-sectional view illustrating a step of applying ink in a step of forming a hole transport layer.
Figure 7B:
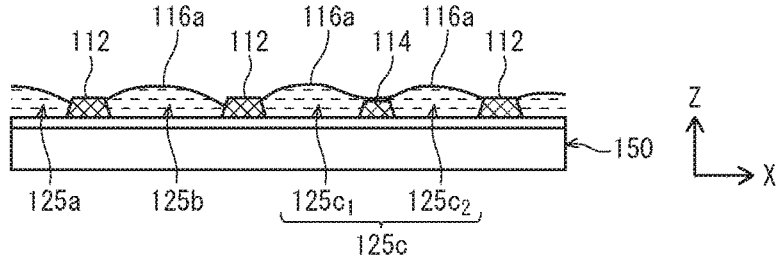
FIG. 7B is a schematic cross-sectional view illustrating the step of applying the ink in the step of forming the hole transport layer.
Figure 7C:
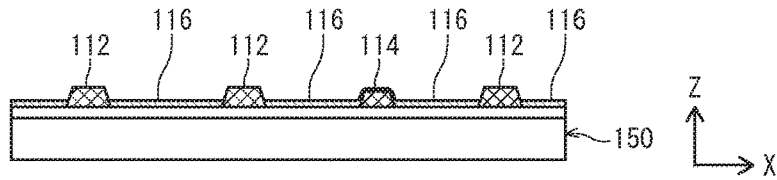
FIG. 7C is a schematic cross-sectional view illustrating the step of applying the ink in the step of forming the hole transport layer.

FIGS. 7A to 7C are schematic cross-sectional views illustrating processes of applying the ink for the hole transport layer.

The ink is a solution of the material for the hole transport layer 116 dissolved in a solvent. The ink application is performed with an ink applying apparatus such that the ink for the hole transport layer is ejected from a nozzle head while the nozzle head is scanned across the groove regions 125a, 125b, and 125c in the bank-formed substrate 150.

The ink is applied to each of the groove regions 125a, 125b, and 125c while the nozzle head is scanned.

FIG. 7A illustrates a state in which an ink layer 116a is formed in each of the groove regions 125a, 125b, and 125c provided between the column banks 112 after the ink for the hole transport layer has been applied. A height of the ink layer 116a just after application is about 20 µm.

As illustrated in FIG. 7A, in the blue groove region 125c having the sub-bank 114, the ink layer 116a is formed spanning the two groove region portions 125c1 and 125c2 provided across the sub-bank 114. In addition, the ink layer 116a is formed covering the sub-bank 114.

Furthermore, although not illustrated, the ink layer 116a is formed also covering the row bank 113 in each of the groove regions 125a, 125b, and 125c.

The ink layer 116a formed in each of the groove regions 125a, 125b, and 125c is dried. The ink layer 116a is preferably dried under reduced pressure because it can be quickly dried at low temperature.

As the ink layer 116a is dried, it is reduced in volume, as illustrated in FIG. 7B. Thus, the ink layer 116a (B) formed in the blue groove region 125c is divided into the groove region portion 125c1 and groove region portion 125c2 across the sub-bank 114 as it is reduced in volume.

Thus, the ink layer 116a (B) is dried and the hole transport layer 116 is formed in each of the groove region portion 125c1 and the groove region portion 125c2.

A thickness of the hole transport layer 116 after drying is considerably smaller than the height of the sub-bank 114, in terms of tens of nm (such as 20 nm).

(Step of Forming Light Emitting Layer 117)

The light emitting layer 117 is formed such that ink for the light emitting layer is applied to and dried in each of the groove regions 125a, 125b, and 125c having the hole transport layers 116 in the bank-formed substrate 150.

Figure 7D:
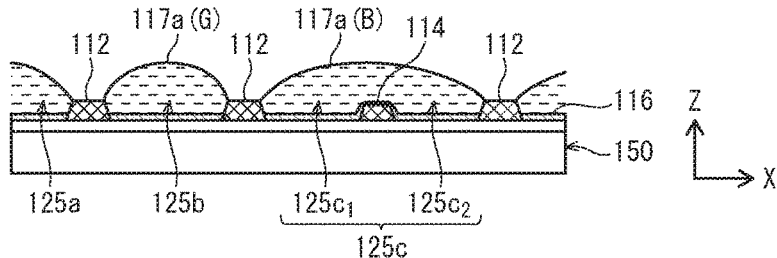
FIG. 7D is a schematic cross-sectional view illustrating a step of applying ink in a step of forming a light emitting layer.
Figure 7E:
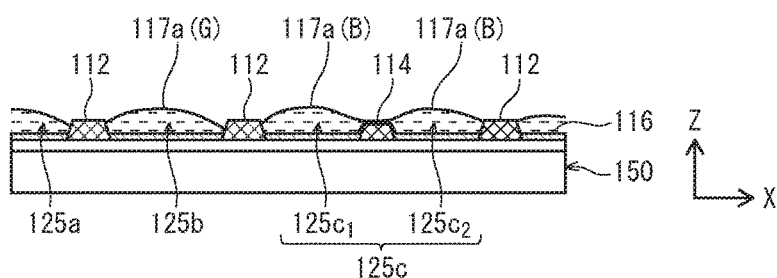
FIG. 7E is a schematic cross-sectional view illustrating the step of applying the ink in the step of forming the light emitting layer.
Figure 7F:
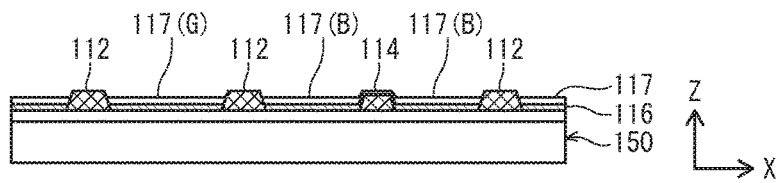
FIG. 7F is a schematic cross-sectional view illustrating the step of applying the ink in the step of forming the light emitting layer.

FIGS. 7D to 7F are schematic cross-sectional views illustrating processes of applying the ink for the light emitting layer.

The ink for the light emitting layer is a solution of the material for the light emitting layer 117 dissolved in a solvent.

This ink application is also performed with the ink applying apparatus such that the ink for the light emitting layer is ejected from the nozzle head to each of the groove regions 125a, 125b, and 125c while the nozzle head is scanned along the surface of the bank-formed substrate 150. Here, it is to be noted that the ink for the red light emitting layer is applied to the groove region 125a, the ink for the green light emitting layer is applied to the groove region 125b, and the ink for the blue light emitting layer is applied to the groove region 125c.

FIG. 7D illustrates a state in which the ink layers 117a (R), 117a (G), and 117a (B) are formed by applying the ink for the light emitting layers to the groove regions 125a, 125b, and 125c provided between the column banks 112, respectively. As illustrated in FIG. 7D, in the groove region 125c having the sub-bank 114, the ink layer 117a is formed covering the sub-bank 114. In addition, in each of the groove regions 125a, 125b, and 125c, the ink layer 117a is formed covering the row bank 113.

The ink layer 117a formed in each of the groove regions 125a, 125b, and 125c is dried.

The ink layer 117a can be also quickly dried at low temperature under reduced pressure.

As illustrated in FIG. 7E, since the ink layer 117a reduces in volume as it is dried, and therefore the ink layer 117a (B) formed in the groove region 125c is partitioned by the sub-bank 114. Thus, the ink layer 117a (B) is dried and the light emitting layer 117 (B) is formed in each of the groove region portion 125c1 and the groove region portion 125c2.

A thickness of the light emitting layer 117 after being dried is also considerably smaller than the height of the sub-bank 114.

(Effects Obtained in Method for Forming Hole Transport Layer 116 and Light Emitting Layer 117)

According to the method for forming the hole transport layer 116, as described above, the ink layer 116a formed in the groove region 125c for the blue subpixel is partitioned by the sub-bank 114 as it is dried, and the ink layer 116a is dried and the hole transport layer 116 is formed in each of the groove region portion 125c1 and the groove region portion 125c2.

That is, the ink layer 116a is dried in each of the groove region portions 125c1 and 125c2 having the small groove width, so that the hole transport layer 116 can be uniform in thickness in the subpixel region.

In addition, in the case where the functional layer is formed such that the ink is applied to and dried in the groove region, when the groove width is small, the functional layer can be uniform in thickness in the subpixel region. This is confirmed by the result of "5. Experiment regarding opening width of groove region and thickness distribution of functional layer" which will be described below.

Similarly, according to the method for forming the light emitting layer 117, the ink layer 117a formed in the groove region 125c is partitioned by the sub-bank 114 as it is dried, and the ink layer 117a (B) is dried and the light emitting layer 117 (B) is formed in each of the groove region portion 125c1 and the groove region portion 125c2.

That is, the ink layer 117a (B) is dried in each of the groove region portions 125c1 and 125c2 having the small groove width, so that the light emitting layer 117 can be uniform in thickness in the subpixel region.

When there is a large difference in thickness in the thickness distribution of the functional layer in the light emitting element 11, a current density is increased in a region having the small thickness, which causes the light emitting element 11 to be degraded in early stage, however, as described above, when the functional layers (the hole transport layer 116 and the light emitting layer 117) have the uniform thicknesses in the subpixel region in the blue light emitting element 11c, a longer life can be expected. Furthermore, brightness unevenness can be prevented from being generated in the pixel of the display panel 10, which can provide an effect of improving the display performance of the display panel 10.

(Effects Provided From Sub-Bank 114 and Row Bank 113 Having Low Liquid-Repellent Property)

The ink layer 116a and the ink layer 117a formed in the groove region 125c as described above are each partitioned by the sub-bank 114 as they are dried and formed in each of the groove region portion 125c1 and the groove region portion 125c2.

Here, when the sub-bank 114 is highly repellent against the ink, the ink existing on the sub-bank 114 flows into one of the groove region portion 125c1 and the groove region portion 125c2 as it is dried, but when the sub-bank 114 is low in liquid-repellent property against the ink, the ink is dried while it is attached on the sub-bank 114 to some extent. Thus, the ink layer 116a (B) and the ink layer 117a (B) can be evenly formed in each of the groove region portion 125c1 and the groove region portion 125c2. As a result, the functional layer thickness of the light emitting element portion 11c1 can be equal to the functional layer thickness of the light emitting element portion 11c2 in the blue light emitting element 11c.

Furthermore, when the row bank 113 is also set low in liquid-repellent property against the ink in each of the groove regions 125a, 125b, and 125c, the ink can be dried while it is attached to the row bank 113 to some extent, so that the ink layer 116a can be evenly formed in each of the two subpixel regions 12 adjacently disposed in the Y direction.

Thus, the thickness of the functional layer can be uniform in each of the light emitting elements 11a, 11b, and 11c disposed in the Y direction.

5. Experiment Regarding Opening Width of Groove Region and Thickness Distribution of Functional Layer Bank-formed substrates of No. 1 to No. 5 were prepared in which opening widths of groove regions have various values, functional layers (a hole transport layer and a blue light emitting layer) were formed in the groove region in each bank-formed substrate by a wet method, and a thickness distribution of each formed functional layer was measured.

The opening width was about 60 µm in No. 1, the opening width was about 80 µm in No. 2, the opening width was about 100 µm in No. 3, the opening width was about 130 µm in No. 4, and the opening width was about 175 µm in No. 5.

Ink for the hole transport layer was applied and dried to form the hole transport layer, and ink for the blue light emitting layer was applied and dried to form the blue light emitting layer in each of the bank-formed substrates of No. 1 to No. 5.

Here, the same ink was applied to each of No. 1 to No. 5, and an applied ink amount per area in the groove region is the same.

Thus, measurements were made for distributions of a thickness of the hole transport layer, a thickness of the light emitting layer, and a height of a light emitting layer surface (that is, a total thickness of the hole transport layer and the light emitting layer).

FIGS. 8A to 8E are graphs showing experiment results in which a row axis represents positions in a transverse direction in the groove region, and a column axis represents thicknesses of the functional layers at each position.

In each of No. 1 to 5, the thickness is small in the vicinity of an end portion of the groove region, and the thickness is large in a center portion of the groove region, and as the opening width increases, a difference in thickness increases between the center portion and the vicinity of the end.

Figure 9:
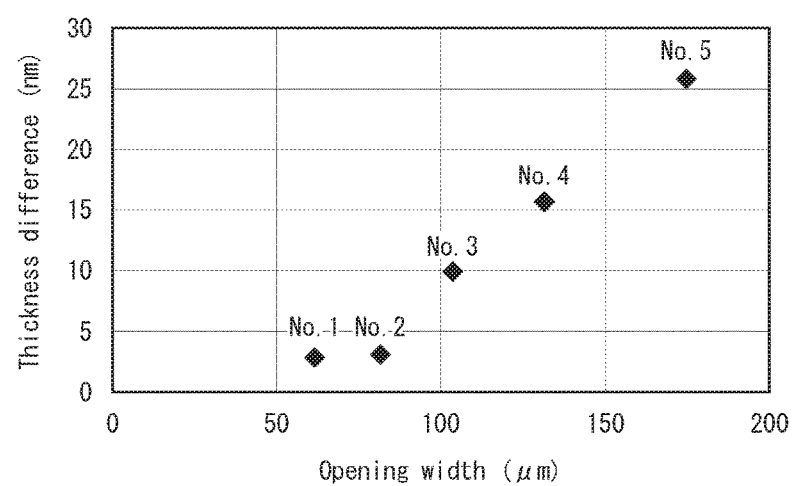
FIG. 9 is a chart showing a relationship between a size of an opening width of the groove region, and a thickness distribution of the functional layer.

FIG. 9 is a graph illustrating a relationship between the size of the opening width of the groove region and the thickness distribution of the functional layer which was obtained from the experiment result.

While the difference in thickness between the center portion and the vicinity of the end is equal to or less than 5

μm in No. 1 and No. 2 having the opening width of 80 μm or less, the difference in thickness between the center portion and the vicinity of the end portion is more than 5 μm in No. 3 to No. 5 having the opening width exceeding 80 μm, and the difference in thickness increases sequentially from No. 3, No. 4, and No. 5 in this order.

From this result, it is found that in the case where the opening width of the groove region is 80 μm or less, the thickness distribution of the functional layer is relatively uniform in the groove region, while in the case where the opening width of the groove region is more than 80 μm, there is a large difference in thickness of the functional layer between the center portion and the vicinity of the end portion in the groove region.

Furthermore, from the above experiment result, it is found that as for the groove regions 115a and 115b having the groove width less than 80 μm, the thickness can be uniform even when the sub-bank is not provided, while as for the groove region 115c having the opening width of 80 μm or more, the sub-bank 114 is preferably provided to divide the groove region into the groove region portions having the opening width of 80 μm or less in order to obtain the uniform thickness.

Modifications (1) In the above embodiment, the one sub-bank 114 is only provided in the blue groove region 115c, but in the case where the width of the groove region 115c is large, a plurality of sub-banks may be provided in the groove region 115c. In this case also, in view of the above experiment result, the number of the sub-banks is to be set so that the groove region portion has the width of about 80 μm after being defined by the sub-banks, and as a result, the sufficiently uniform thickness can be provided.

For example, in a case where a width of the groove region is 240 μm, the two sub-banks (a bank width is 15 μm) is provided in the groove region so that the groove region is divided into three groove region portions each having a width of 70 μm, and as a result, the functional layer can be uniform in thickness.

(2) In the above embodiment, the hole transport layer 116 and the light emitting layer 117 of the blue light emitting element 11c are formed in each of the two groove region portions 125c1 and 125c2 partitioned by the sub-bank 114, but even when the hole transport layer 116 is not formed and only the light emitting layer 117 is formed in each of the two groove region portions 125c1 and 125c2 partitioned by the sub-bank 114, the light emitting layer 117 can be similarly uniform in thickness in the blue light emitting element 11c.

Furthermore, the hole injection layer 104 may be formed in each of the two groove region portions 125c1 and 125c2 partitioned by the sub-bank 114 after the sub-bank 114 has been formed on the pixel electrode 103, or the pixel electrode 103 also may be formed in each of the two groove region portions 125c1 and 125c2 partitioned by the sub-bank 114 after the sub-bank 114 has been formed on the interlayer insulating layer 102. In addition, in the case where the pixel electrode 103 is formed as described above the two pixel electrode portions need to be electrically connected to each other. In either case, an upper end of the sub-bank 114 is preferably closer to the surface of the TFT substrate 110 than an upper end of the column bank 112, regardless of the position of a lower end of the sub-bank 114. Furthermore, since a distance from the surface of the TFT substrate 110 to the lower end of the sub-bank 114 is larger than or equal to a distance to a lower end of the column bank 112, the height (thickness) of the sub-bank 114 is preferably smaller than the height (thickness) of the column bank 112.

(3) In the above embodiment, the row bank and the sub-bank are collectively formed in the same step, but the row bank and the sub-bank may be formed in different steps. Furthermore, in the above embodiment, the row bank and the sub-bank have the same height, but the height of the row bank may be different from the height of the sub-bank.

Furthermore, the sub-bank and the column bank may be collectively formed in the same step. In this case, the height of the sub-bank may be made equal to the height of the column bank, but the height of the sub-bank can be made smaller than that of the column bank by performing a process in which when the photosensitive bank material layer is exposed and cured, the column bank portion is sufficiently cured and the sub-bank portion is half cured with use of a half-tone mask.

(4) In the above embodiment, the sub-bank 114 is formed in the blue groove region 115c, but in a case where the red groove region 115a or the green groove region 115b has a large width, the sub-bank 114 is to be provided in the groove region 115a or the groove region 115b, so that the thickness of the functional layer can be uniform in the red light emitting element or the green light emitting element.

(5) In the above embodiment, the description has been given to the case where the hole transport layer 116 and the light emitting layer 117 of the display panel 10 are formed by the wet method, but as another case, the functional layer other than the hole transport layer and the light emitting layer may be formed by the wet method, that is, the hole injection layer, electron transport layer, and the electron injection layer may be formed by the wet method, and in this case also, they can be formed similarly, and the same effect can be provided.

Furthermore, instead of the organic EL display panel, the above method can be also applied to a case where a functional layer is formed in an organic EL lighting, and the same effect can be also provided.

(6) In the above embodiment, the description has been given to the case where the sub-bank is formed in the groove region defined by the line banks, but the sub-bank may be formed in the groove region defined by pixel banks, and it works similarly.

Figure 10:
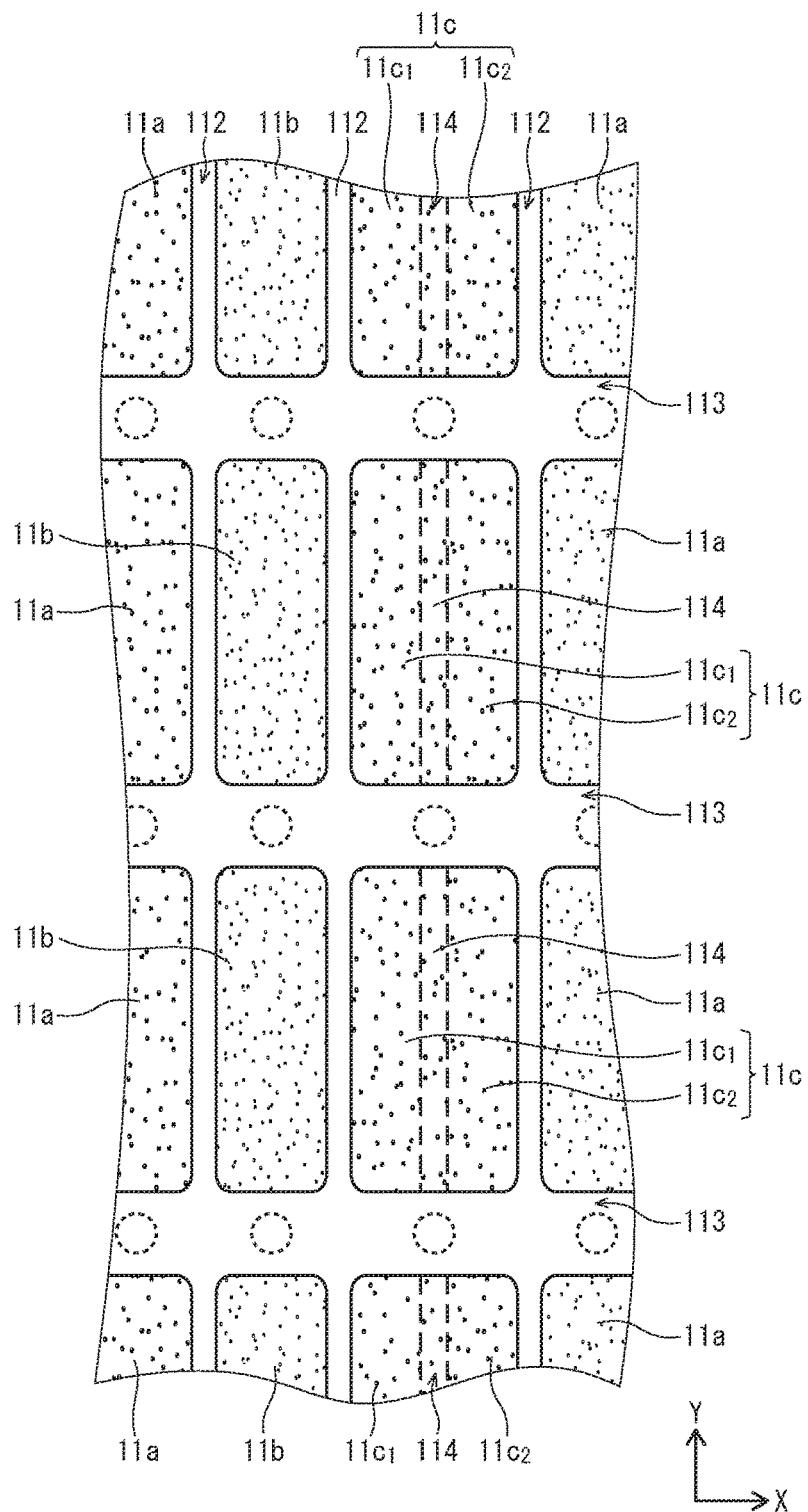
FIG. 10 is a schematic plan view of a modification in which a sub-bank is formed in a display panel having pixel banks.

FIG. 10 shows an example in which the sub-bank 114 is formed in a blue groove region in a display panel having the pixel banks.

The pixel banks illustrated in FIG. 10 are formed in which the plurality of column banks 112 extending in the Y direction intersect with the plurality of row banks 113 extending in the X direction. Thus, each of the light emitting elements 11a, 11b, and 11c is formed in a rectangular region surrounded by the column banks 112 and the row banks 113.

Similar to the above embodiment, in this display panel in this variation, the plurality of light emitting elements 11 (11a, 11b, and 11c) are disposed in the groove regions defined by the plurality of column banks 112. Thus, the groove region having the blue light emitting element 11c has an opening width set larger than those of the red light emitting element 11a and the green light emitting element 11b.

Thus, similar to the above embodiment, in the display panel including the pixel banks, the sub-bank 114 extending in the Y direction is provided in the blue groove region, and the functional layer of the light emitting element 11c is divided by the sub-bank 114, so that the same effect can be provided. That is, each of the light emitting element portion 11c1 and the light emitting element portion 11c2 partitioned by the sub-bank 114 has a small opening width, so that the functional layer can be uniform in thickness.

(7) According to the above embodiment, an example is described of forming functional layers of a top-emission type of the display panel 10, but this can also be applied to forming functional layers of a bottom-emission type of display panel, achieving the same effect.

INDUSTRIAL APPLICABILITY

The organic light emitting device according to the present invention is applicable to, for example, household, public-institutional, and industrial various display devices, television appliances, and displays for portable electronic devices.

REFERENCE SIGNS LIST 1 organic EL display device
10 display panel
11a red light emitting element
11b green light emitting element
11c blue light emitting element
11c1, 11c2 light emitting element portion
12 sub-pixel region
100 substrate
101 TFT layer
102 interlayer insulating layer
103 Pixel electrode
104 hole injection layer
110 TFT substrate
112 column bank
113 row bank
114 sub-bank
115a groove region
115b groove region
115c groove region
116 hole transport layer
116a ink layer
117 light emitting layer
117a ink layer
118 electron transport layer
119 cathode
120 sealing layer
121 resin layer
124 substrate
125a, 125b, 125c groove region
125c1, 125c2 groove region portion
150 bank-formed substrate

What is claimed is:

1. A light emitting device, comprising:
a base substrate;
a plurality of first electrodes on the base substrate;
a plurality of banks extending along a periphery of the first electrodes above a surface of the base substrate; and
a plurality of light emitting elements extending along a direction in a plurality of groove regions defined by the banks; and
a plurality of second electrodes covering the light emitting elements,
wherein
each of the light emitting elements includes one or more functional layers between the first electrodes and the second electrodes,
within at least one of the groove regions:
a sub-bank extends along the direction and has a height equal to or smaller than a height of the banks,
for each of the one or more functional layers in the at least one of the groove regions, portions of each of the one or more functional layers on each side of the sub-bank are made of a same material, and
a thickness of the one or more functional layers is smaller than a height of the sub-bank.

2. The light emitting device according to claim 1, wherein the sub-bank is continuous, in the direction, from one end to another end of each of the light emitting elements in the at least one of the groove regions.

3. The light emitting device according to claim 1, wherein an upper end of the sub-bank is closer to the surface of the base substrate than an upper end of each of the banks.

4. The light emitting device according to claim 1, wherein a plurality of second banks is in each of the groove regions, the second banks partitioning, in the direction, the one or more functional layers of adjacent light emitting elements.

5. The light emitting device according to claim 4, wherein an upper end of each of the second banks is closer to the surface of the base substrate than an upper end of each of the banks.

6. The light emitting device according to claim 5, wherein the second banks and the sub-bank have a same height.

7. The light emitting device according to claim 1, wherein in the at least one of the groove regions in which the sub-bank extends, each of the first electrodes which is under the one or more functional layers spans the portions of the one or more functional layers on each side of the sub-bank.

8. The light emitting device according to claim 7, wherein in the at least one of the groove regions in which the sub-bank extends, each of the first electrodes is under peripheral portions of the banks which define the at least one of the groove regions.

9. The light emitting device according to claim 8, wherein each of the first electrodes is provided separately for one of the light emitting elements.

10. The light emitting device according to claim 1, wherein
each of the at least one of the groove regions in which the sub-bank extends has a groove width of at least 80 μm, and
each of the portions of each of the one or more functional layers on each side of the sub-bank has a width of at most 80 μm.

11. The light emitting device according to claim 1, wherein
each of the at least one of the groove regions in which the sub-bank extends includes small and large groove widths, and
the sub-bank is disposed at least in a groove region having a largest groove width among the groove widths.

12. The light emitting device according to claim 1, wherein
in the at least one of the groove regions in which the sub-bank extends, the sub-bank is above the substrate and each of the first electrodes and below each of the one or more functional layers of each of the light emitting elements.

13. The light emitting device according to claim 12, wherein
in the at least one of the groove regions in which the sub-bank extends, each of the light emitting elements is directly on the sub-bank.

14. The light emitting device according to claim 1, wherein
the sub-bank has a lower liquid repellency than the banks.

15. The light emitting device according to claim 1, wherein
the sub-bank and the banks comprise a same material.

* * * * *